(12) United States Patent
Chigullapalli et al.

(10) Patent No.: US 12,295,118 B1
(45) Date of Patent: May 6, 2025

(54) LIQUID IMMERSION COOLING SYSTEM

(71) Applicant: ZT Group Int'l, Inc., Secaucus, NJ (US)

(72) Inventors: Sruti Chigullapalli, Secaucus, NJ (US); Tommy Lin, Secaucus, NJ (US); Chen An, Secaucus, NJ (US); Mahesh Kumar Varrey, Secaucus, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 188 days.

(21) Appl. No.: 18/075,989

(22) Filed: Dec. 6, 2022

(51) Int. Cl.
*H05K 7/20* (2006.01)

(52) U.S. Cl.
CPC ........... *H05K 7/203* (2013.01); *H05K 7/2039* (2013.01); *H05K 7/20809* (2013.01)

(58) Field of Classification Search
CPC ... H05K 7/203; H05K 7/2039; H05K 7/20809
USPC .................................................. 361/679.47
See application file for complete search history.

(56) References Cited

U.S. PATENT DOCUMENTS

| | | | | |
|---|---|---|---|---|
| 4,302,793 A * | 11/1981 | Rohner | ............. | H05K 7/20272 361/689 |
| 4,949,164 A * | 8/1990 | Ohashi | ................. | H01L 23/427 165/80.4 |
| 10,143,113 B2 * | 11/2018 | Shelnutt | ................... | G06F 1/20 |
| 10,416,736 B2 * | 9/2019 | Dupont | ............. | H05K 7/20936 |
| 10,645,841 B1 * | 5/2020 | Mao | .................... | H05K 7/20781 |
| 10,782,751 B1 * | 9/2020 | Gauthier | ............. | F24D 17/0042 |
| 10,985,537 B2 * | 4/2021 | Yang | ........................ | H02B 1/24 |
| 11,357,130 B2 * | 6/2022 | Manousakis | .............. | G06F 1/20 |
| 11,375,638 B2 * | 6/2022 | Cheng | ................ | H05K 7/20818 |
| 11,744,043 B2 * | 8/2023 | Gao | ........................ | H05K 7/203 361/679.53 |
| 11,839,053 B2 * | 12/2023 | Wu | ..................... | H05K 7/20318 |
| 2016/0330873 A1 * | 11/2016 | Farshchian | ........ | H05K 7/20663 |
| 2022/0408587 A1 * | 12/2022 | Kelley | .............. | H05K 7/20809 |
| 2022/0408612 A1 * | 12/2022 | Peterson | ............ | H05K 7/20327 |
| 2024/0147664 A1 * | 5/2024 | Tsang | .................... | H05K 7/203 |

* cited by examiner

*Primary Examiner* — Anatoly Vortman
(74) *Attorney, Agent, or Firm* — Dergosits & Noah LLP; Todd A. Noah

(57) ABSTRACT

An apparatus is provided for improving the cooling of a heat source. The apparatus includes a deflector mounted in a space between a first heat source and a second heat source. The deflector has a first face at a first angle that is greater than perpendicular from a first plane and a second face at a second angle that is less than perpendicular from a second plane. The apparatus further includes a plurality of vanes that extend from the first face of the deflector and are rotated inwardly with respect to the first face. When the first and second heat sources are immersed in a fluid and oriented with the second heat source above the first heat source, as fluid heated by the first heat source rises, the heated fluid is directed by the deflector away from the second plane and is directed by the plurality of vanes toward a center of the deflector.

20 Claims, 8 Drawing Sheets

LIQUID IMMERSION COOLING SYSTEM

FIELD OF THE INVENTION

The present subject matter relates generally to cooling systems and particularly to cooling systems for immersive cooling systems.

BACKGROUND

In typical two phase liquid immersion cooling, server boards are oriented vertically in immersion tanks. Current immersion cooling technology uses boiler plates, which are usually two dimensional structures. In such two phase immersion cooling, heat is dissipated at the boiler plate into the fluid, causing the fluid to undergo a phase change from liquid to vapor. The vapor then rises to the fluid surface where it condenses back into liquid form on condenser coils. An issue with boiler plates is that heat is not necessarily uniformly distributed, particularly when the boiler plate is much larger than the surface of the component. Also, heat transfer can be reduced when rising vapor bubbles pass over high power components (GPUs, etc.) that are in a vertically shadowed configuration, especially in a densely populated server. Too many vapor bubbles passing over a high power component's boiler plate will impede the heat transfer from the boiler plate into the fluid by separating the boiler plate from the fluid. As the number of bubbles increases, so does the risk of "dry out" at the surface of the boiler plate—in which a vapor layer forms on the boiler plate, effectively insulating it from the fluid.

The potential for dry out is greater in regions of high thermal design power (TDP) and low fluid flow areas, which occur in densely populated servers. The heat transfer in such regions would benefit from the bubbles having an escape path.

Thus, what is needed is an apparatus and system that provides an escape path that diverts bubbles from the boiler plates of vertically shadowed high-power components.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a liquid immersion cooling system in which 3D surfaces added to boiler plates extend heat transferring surfaces into the liquid. This distributes the heat and the associated creation of bubbles to liquid that is separated from the boiler plate.

Thus, as bubbles rise, they are not directly beneath the boiler plate and the potential for dry out is reduced. In embodiments, the 3D surfaces may be heatsinks. In embodiments, the 3D surfaces may be a type of heat sink known as a vapor chamber pillar. This strategy may be employed in both lidded and lid-less immersion systems. Furthermore, vapor chamber pillars may be customized to adapt to a chip heat flux map.

Embodiments described within also disclose a vapor bubble guide, which is a deflector with vanes. The deflector channels rising bubbles away from the board, which works to reduce the potential for dry out. The vanes, provided on the lower face of the deflector, channel rising bubbles to one side or another to create an upward bubble flow path that reduces the interference between the upward flow of bubble and the downward flow of returning fluid, which enhances to the return flow of liquid to the heat sources and their cooling.

Figure 1:
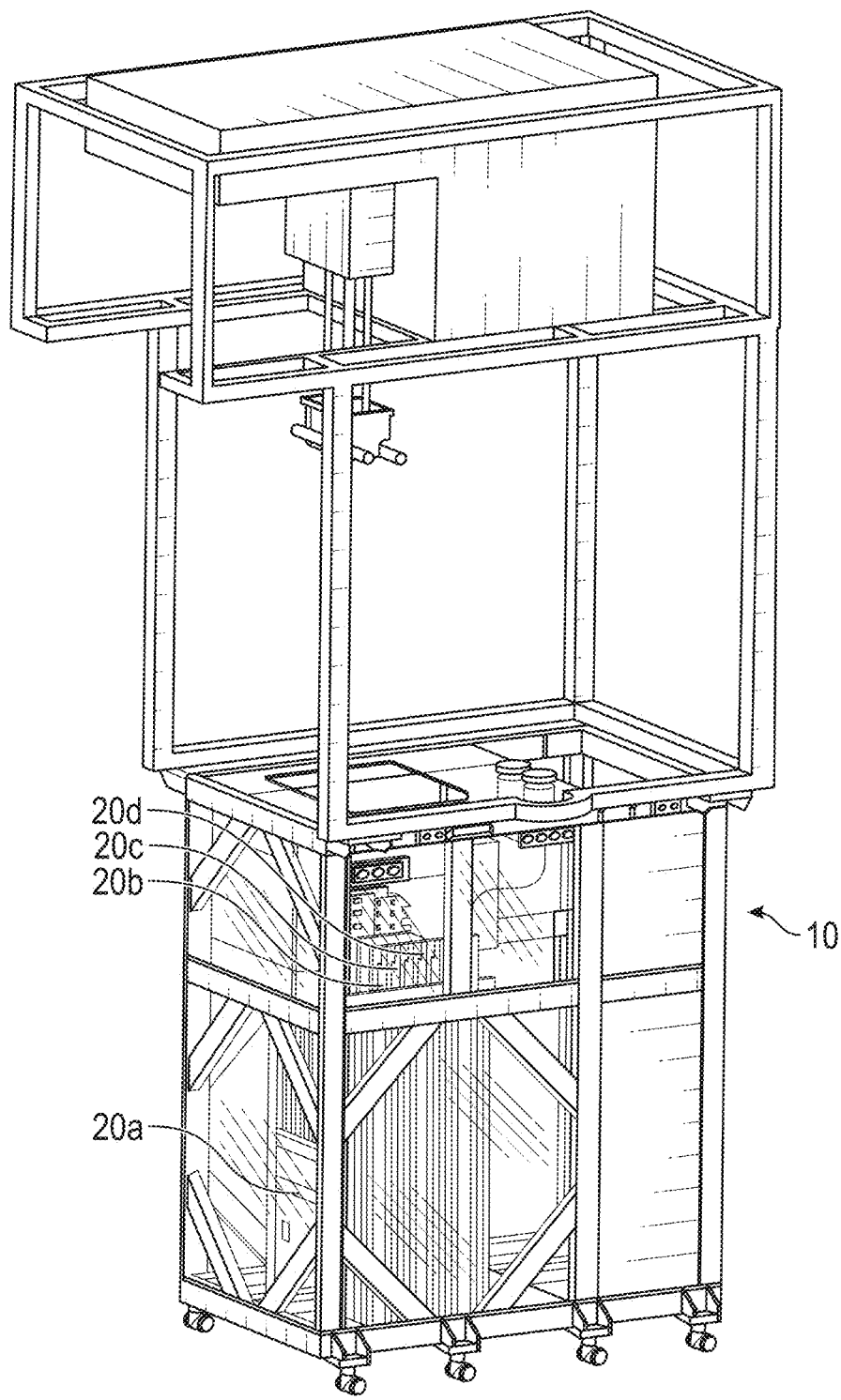
FIG. 1 is a perspective view of an immersion cooler of the prior art.
Figures 2A, 2B:
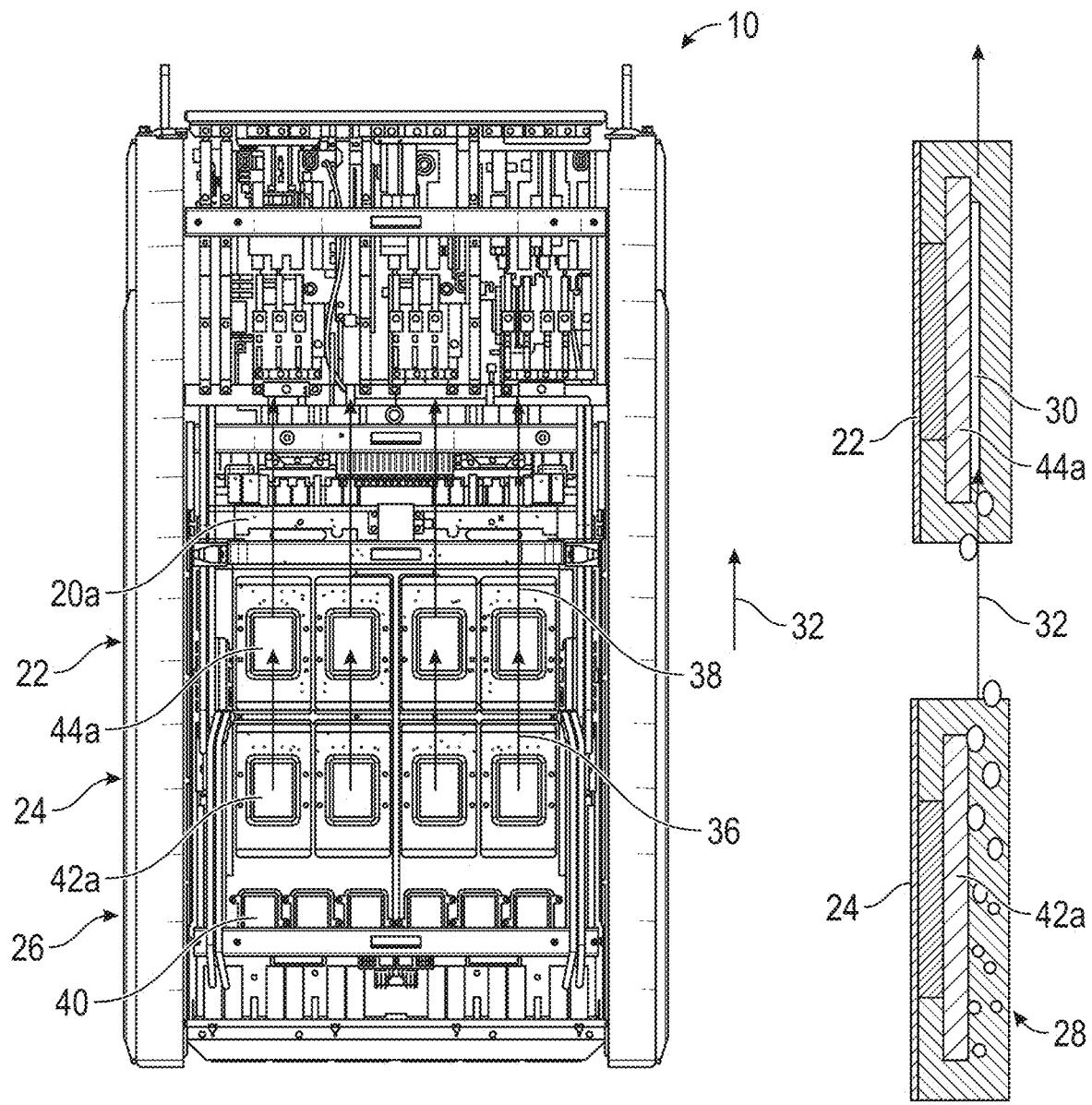
FIG. 2A is a front view of a prior art server board in the immersion cooler of FIG. 1.
FIG. 2B is a left view of elements of the prior art server board of FIG. 2A.

FIG. 1, FIG. 2A, and FIG. 2B illustrate the problem addressed. FIG. 1 is a perspective view of an immersion cooler 10 of the prior art. In FIG. 1, server boards 20a . . . 20d are immersed in a cooling solution. In FIG. 2A, server board 20a, for example, includes a row of GPUs 22, above a second row of GPUs 24, above a third row of processors 26. Bubbles 28 formed by heat transferred from lower boiler plates, e.g., plate 42a of GPU row 24, rise in a general bubble path 32 and flow directly to the vertically "shadowed" GPU row above, e.g., GPU row 22. Thus, with reference to FIG. 2B, bubbles 28 may, if overabundant, cover the shadowed boiler plate, e.g., plate 44a, and create an insulating layer 30—the dry out—which is to be avoided. A bubble path 36 refers to the bubble path between GPU row 24 and row 22. A bubble path 38 refers to the bubble path above GPU row 22. In this disclosure, reference numbers that include a letter designation denote specific instantiations of the same element of the embodiment. Thus, description of one instantiation of the element is generally applicable to the other instantiations of that element as does the general description of the element, except for, e.g., location-specific discussion. For example, description of boiler plate 42a generally applies to all boiler plates 42a . . . 42d (FIG. 4) and a description of a boiler plate 42 applies to all boiler plates 42a . . . 42d.

Figure 3:
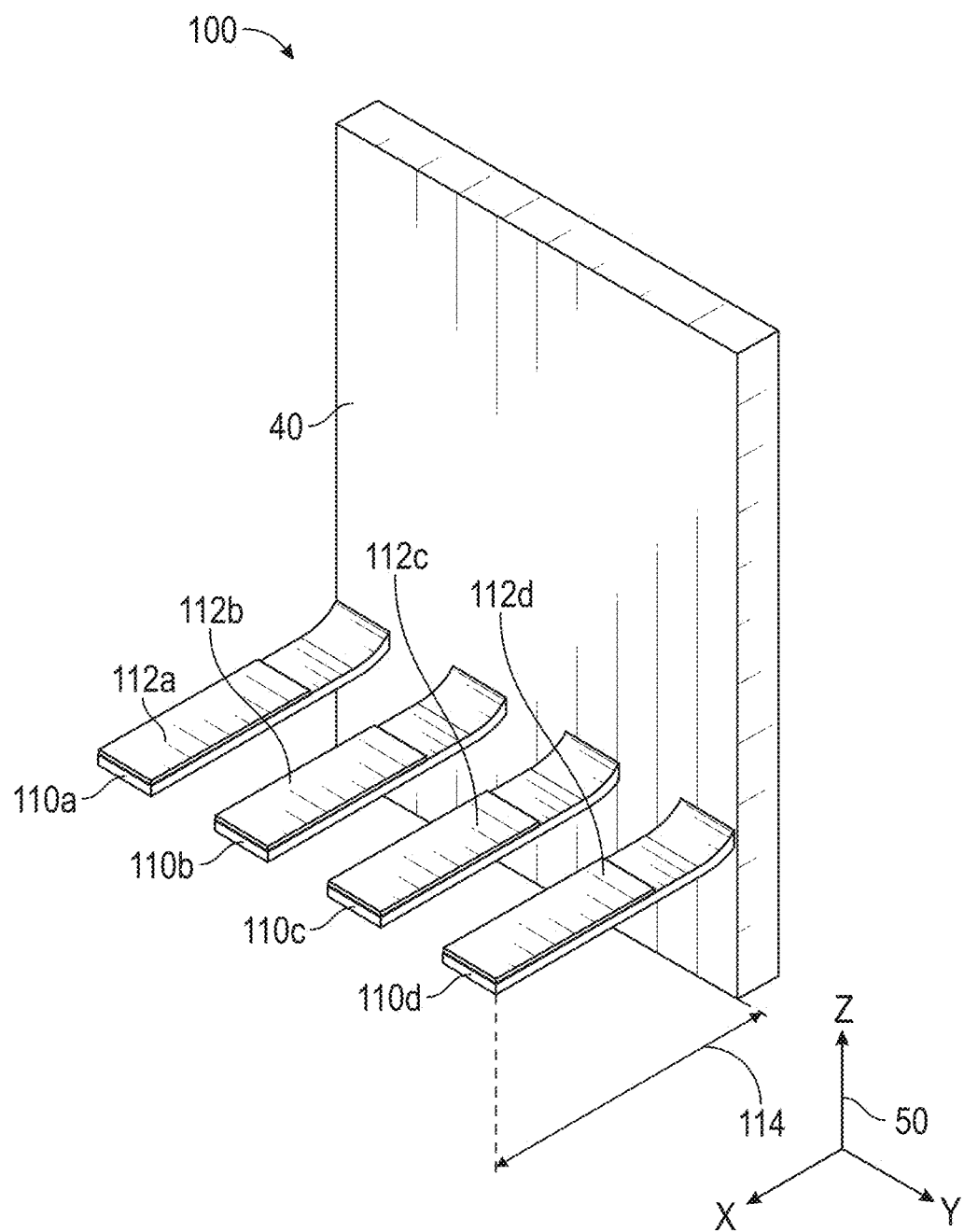
FIG. 3 is An upper front right perspective view of aspects of an embodiment of a liquid immersion cooling system.

FIG. 3 is an upper front right perspective view of aspects of an embodiment of a liquid immersion cooling system 100. In FIG. 3, system 100 includes the addition of one or more vapor chamber pillars, e.g., vapor chamber pillars 110a . . . 110d, to a boiler plate, e.g., plate 40. In an embodiment, the pillars may receive a boiler enhancement coating 112, which increases heat transfer from the pillar to the fluid by promoting the creation of bubbles. The pillars distribute the heat transfer away from the boiler plate 40 along a distance 114 in direction x of an axial orientation 50 (which will remain consistent in this discussion). As a result, not all of the heat transferred through plate 40 results in the creation of bubbles at the surface of the plate. Instead, heat transferred through plate 40, into the vapor chamber pillars, and from the pillars into the fluid, results in the creation of bubbles along the entire x, y surface of the pillar. This results in a reduction in the quantity of bubbles that rise in the z direction and contact the shadowed heat source above. A feature of vapor chamber (VC) pillars is that, due to their nature, VC pillars transport heat away from plate 40 more than, say, a standard heat sink. For example, and with coatings 112 applied, more bubbles will be formed at the ends and at the coated sections 112 of VC pillars 110*a* . . . 110*d* than at the pillar section between the coated sections and plate 40. In contrast, with a standard heat sink, the heat energy dissipated is greatest at the base of the heat sink next to the boiler plate and decreases as the heat sink extends away from the boiler plate. Thus, the use of VC pillars creates a greater separation between bubbles and the plate than would a standard heat sink. However, in an embodiment, heat sinks may be used instead of or in addition to VC pillars.

Figure 4:
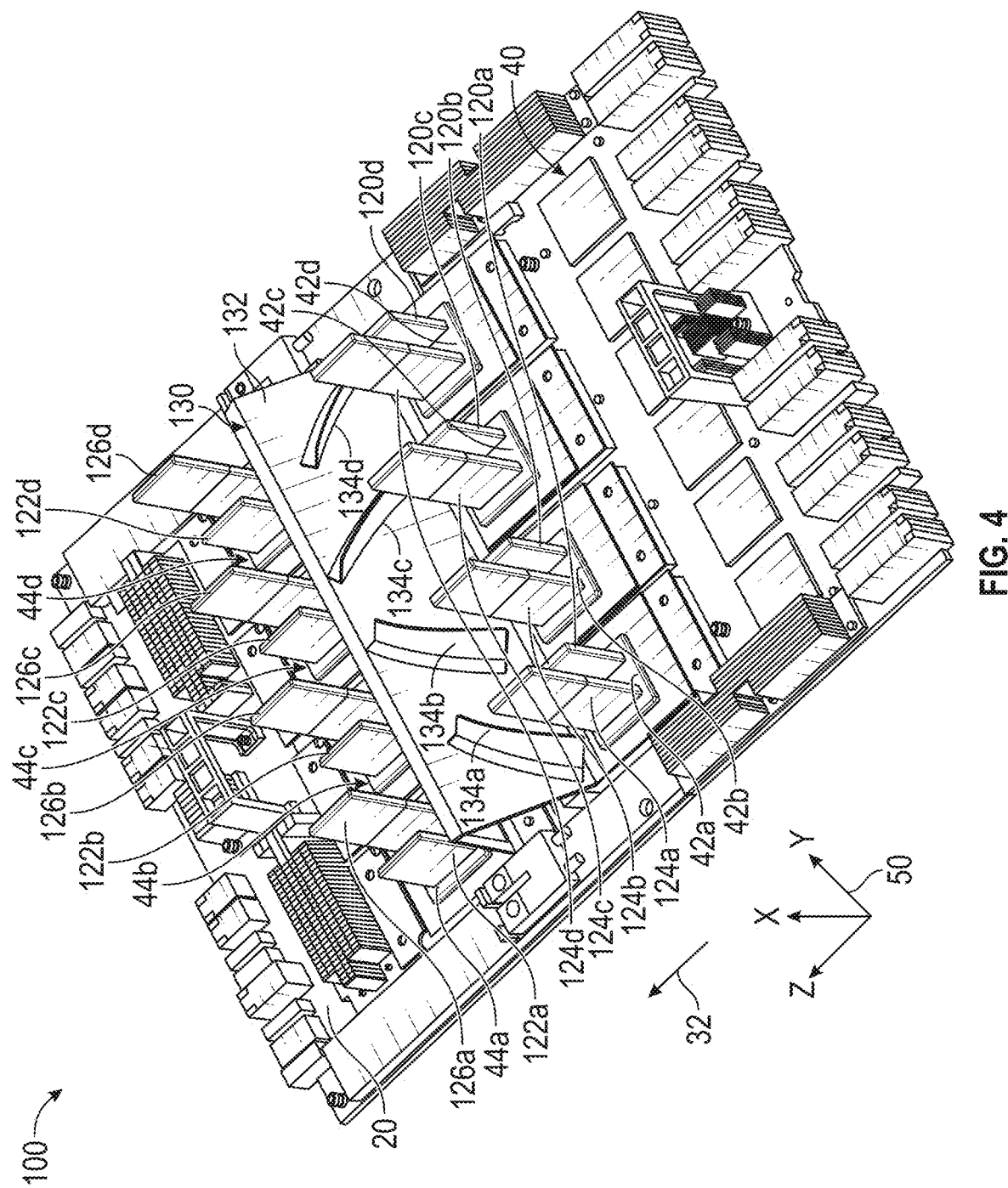
FIG. 4 is a lower front left perspective view of aspects of an embodiment of a liquid immersion cooling system.

FIG. 4 is a lower front left perspective view of aspects of an embodiment of a liquid immersion cooling system 100. In FIG. 4, system 100 includes: short vapor chamber (VC) pillars 120, 122, long VC pillars 124, 126; and a bubble guide (also called a deflector) 130. VC chambers 120, 124 are attached at their base to boiler plates 42. VC chambers 122, 126 are attached to boiler plates 44. When server board 20 is immersed in tank 10 with z-axis 50 oriented vertically, bubbles created at VC pillars 122, 126 following bubble path 32. Bubbles created at VC pillars are less likely to cause dry out at the shadowed boiler plates 44 because their bubble path is effected by two aspects of the embodiment: VC pillars 120, 124 and bubble guide 130. VC pillars 120, 124 reduce the potential for dry out by distributing the creation of bubbles along the VC pillar in the x-axis direction. Thus, most bubbles created by a VC pillar 120, 124 do not have an initial flow path that intersects a boiler plate 44. Bubble guide 130 directs bubbles it encounters away from board 20. In embodiments, the distance bubble guide 130 directs bubbles away from board 20 may range from a relatively short distance, e.g., half the x-dimension of short VC pillar 122, to a relatively long distance, e.g., a distance greater than the height of pillars 126. The distances prevent bubbles from VC pillars 120, 124 from potentially causing dry out on boiler plates 44 and on at least sections of pillars 122, 126.

Bubble guide 130 disrupts bubble flow in the following manner. Bubble guide 130 includes a guide face 132 that ramps away in the x-axis 50 from server board 20. As bubbles created by VC pillars 120, 124 rise, they encounter guide face 132 and, as they rise further, are directed in the x direction away from board 20. Thus, when a bubble rises enough to pass by guide face 132, pillars 126 are not in the bubble's flow path. In addition, bubble guide 130 includes vanes 134, which impart a component of movement in the y-axis 50 direction to a rising bubble. Vanes 134*a*, 124*b* add a positive y-axis component of movement and vanes 134*c*, 134*d* impart a negative y-axis component of movement. Thus, as bubbles created by VC pillars 120*a*, 120*b*, 124*a*, 124*b* rise and encounter one of vanes 134*a*, 134*b*, they are directed in the positive y-axis direction until they pass by the vane. Similarly vanes 134*c*, 134*d* direct bubbles in the negative y-axis direction. As shown in FIG. 4, boiler plates 42*a* . . . 42*d* and 44*a* . . . 44*d* are attached to board 20 and are on the same plane. However, in embodiments, boiler plates 42*a* . . . 42*d* may be slightly offset from boiler plates 44*a* . . . 44*d* such that plates 42*a* . . . 42*d* are on a first plane and plates 44*a* . . . 44*d* are on a second plane without departing from the teachings of this specification. For example, in FIG. 2B, plate 44*a* may be in a slightly different plane that plate 42*a* and still experience dryout from bubbles 28, a condition that would be prevented by embodiments.

In an embodiment, a boiler enhancement coating may be applied to some or all of a VC pillar. For example, in FIG. 4, long VC pillars 124, 126 may be coated with a boiler enhancement coating on the section furthest from boiler plates 42, 44 (demarcation indicated by a solid line) and short VC pillars 120, 122*a* may be coated from base to tip.

Figure 5:
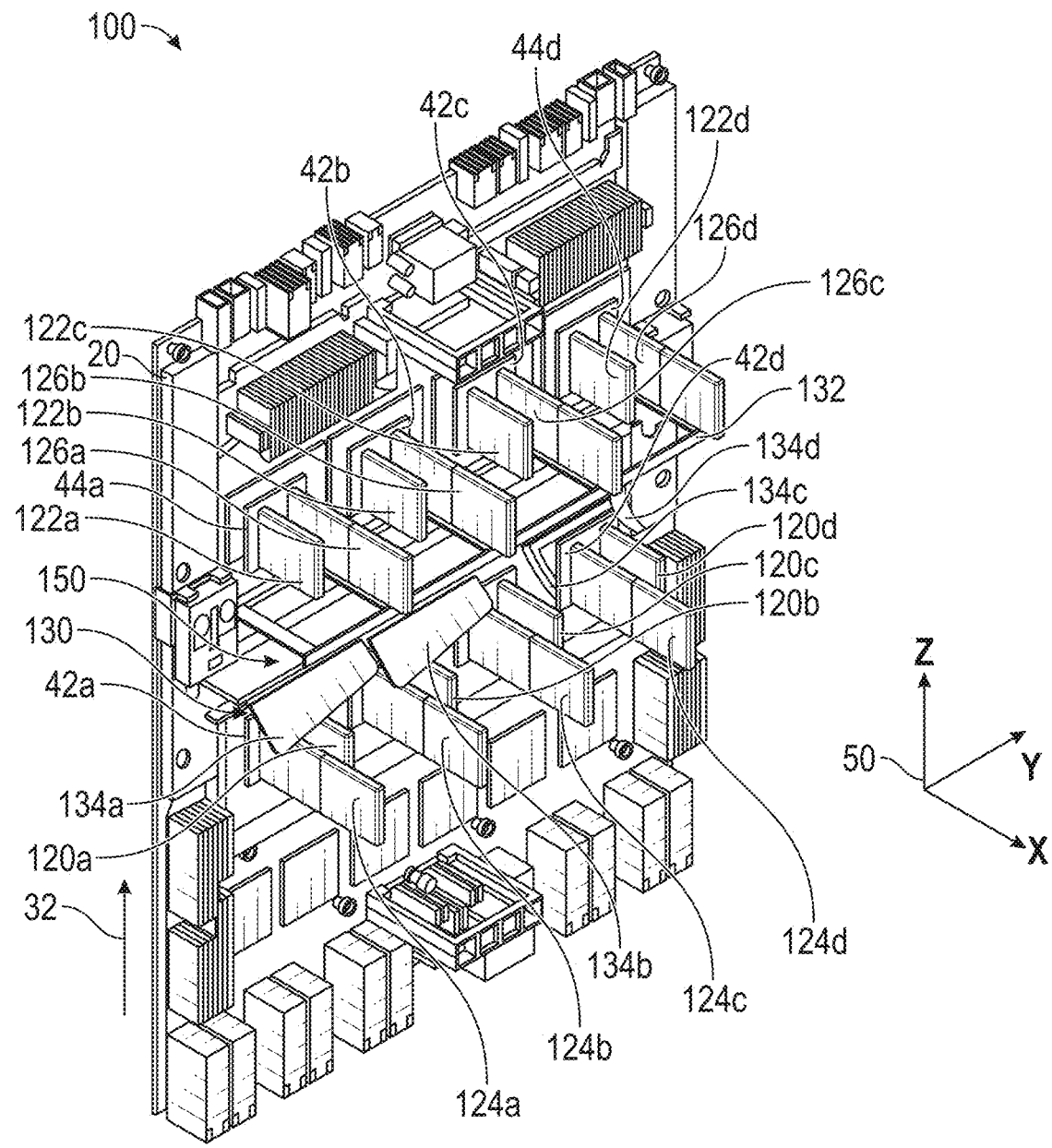
FIG. 5 is an upper front left perspective view of aspects of the embodiment of a liquid immersion cooling system of FIG. 4.

FIG. 5 is an upper front left perspective view of aspects of the embodiment of liquid immersion cooling system 100 of FIG. 4. In FIG. 5, board 20 is shown oriented as it would be in immersion tank 10. The view illustrates the relatively "inward" deflection of vanes 134*a* . . . 134*d*. In addition, it is shown that guide face 132 does not necessarily need to extend further from board 20 than VC pillars 126 for boiler plates 44 to benefit, e.g., not experience dry out. Furthermore, the view illustrates a trough 150 below VC pillars 122, 126 and above guide face 132. Trough 150 provides a flow path for returning dense cooling liquid to reach boiler plates 44 and will be discussed with reference to FIG. 6A and FIG. 6B.

Figures 6A, 6B:
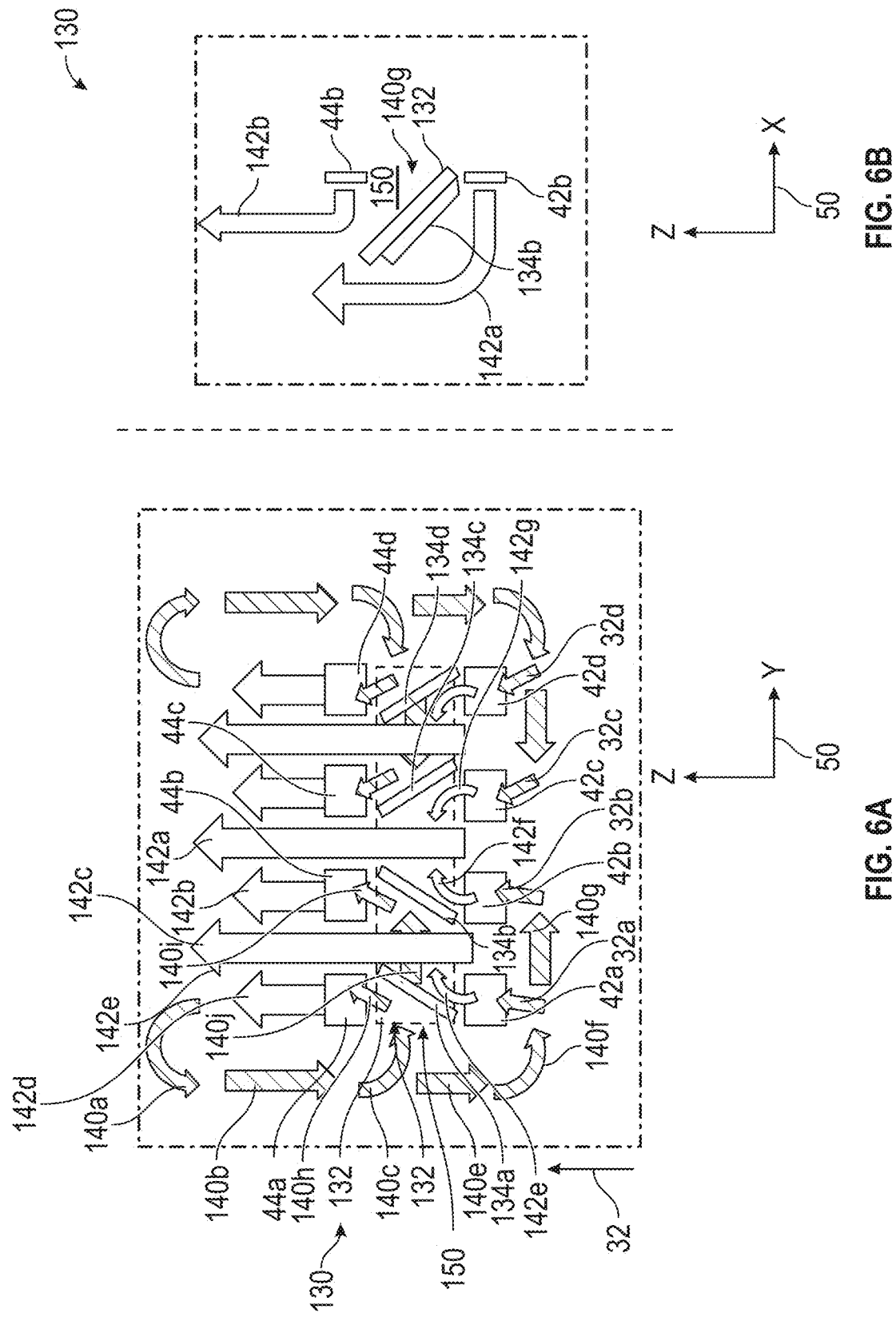
FIG. 6A is a schematic illustrating a front view of aspects of the embodiment of a liquid immersion cooling system of FIG. 4.
FIG. 6B is a schematic illustrating a right view of aspects of the embodiment of a liquid immersion cooling system of FIG. 4.

FIG. 6A is a schematic illustrating a front view of aspects of the embodiment of liquid immersion cooling system 100 of FIG. 4. FIG. 6A generally describes the flow of low density gas and high density gas in system 100 in the y, z plane 50. In FIG. 6A, the disruption of bubble flow 32 caused by bubble guide 130 is discussed using arrows 140 to represent high-density liquid paths and arrows 142 to represent low density liquid or gas (e.g., bubbles 28) paths. This discussion will be directed to the left side of system 100, but applies equally to the right side, which mirrors the left.

In FIG. 6A, low density liquid/gas paths 142*b*, 142*d* are created by boiler plates 44*a*, 44*b* and their associated VC pillars (FIG. 4, FIG. 5) and parallel bubble path 32. Low density liquid/gas path 142*a* is created by boiler plates 42*b*, 42*c* and their associated VC pillars (FIG. 4, FIG. 5), which create low density liquid/gas flows that initially at least partly follows paths 142*f* and 142*g* along vanes 134*b* and 134*c*, and merge to form low density liquid/gas flow 142*a*. Low density liquid/gas path 142*c* is created by boiler plate 42*a* and its associated VC pillar (not shown here), which creates low density liquid/gas flow that initially at least partly follows path 142*c* along vane 134*a*.

High density liquid 140 is created by the cooling and condensation of low density liquid/gas 142. High density liquid path 140 is generally initially pushed toward the side 140*a* because of the upward convective driving force of the flows 142*a* . . . 142*d*. It then follows path 140*b* down to bubble guide 132, at which point part is drawn by the current created by the convective flows 142*b*, 142*d* along path 140*c* into trough 150, and from there to flows 140*h*, 140*j*, and 140*i*. Thus, a flow path is created that provides boiler plates 44*a*, 44*b* with cooling fluid in a more efficient manner than if returning cooling high-density fluid had to compete with rising low-density liquid/gas for the same flow path back to the boiler plate. Past bubble guide 132, high-density paths 140*e*, 140*f* supply fluid to boiler plate 42*a*, with 140*g* supplying boiler plate 42*b*. Thus, as with plates 44*a*, 44*b*, a flow path is created that provides boiler plates 42*a*. 42*b* with cooling fluid in a more efficient manner than if returning cooling high-density fluid had to compete with rising low-density liquid/gas for the same flow path back to the boiler plate.

FIG. 6B is a schematic illustrating a right view of aspects of the flow path of FIG. 6A. FIG. 6A generally describes the flow of low density gas and high density gas in system 100 in the x, z plane 50. In FIG. 6B, low density liquid/gas path 142b is shown to be largely distanced from boiler plate 44b in the negative x-axis direction. This is due to the bubbles being created along VC pillars 122b, 126b (FIG. 4, FIG. 5). Thus, there are fewer bubbles from a lower section of plate 44b with a chance to cause dry out on plate 44b. Trough 150 indicates the area in which high density flow 140j travels in returning to plate 44b. Low density liquid/gas path 142a is also shown to be largely distanced from boiler plate 42b in the negative x-axis direction, due to the bubbles being created along VC pillars 120b, 124b. Thus, there are fewer bubbles from a lower section of plate 42b with a chance to cause dry out on plate 42b. In addition, guide face 132 causes all flow 142a to pass above boiler plate 44b, which prevents bubbles in flow 142a from contributing to dry out of plate 44b.

As shown in FIG. 6A and FIG. 6b, the embodiment creates a flow path for high density and low density fluid around and below the upper-level boiler plates 44a . . . 44d. The low density vapor from lower-level boiler plates 42a . . . 42d is deflected by guide surface 132 away from the upper plates, and high density liquid is returned to the lower plates initially along the same path that supplies the upper plates. The paths for the liquid and vapor are self-regulating through the convection caused by the phase change and buoyancy, and with the direction of bubble guide 130.

Figure 7A:
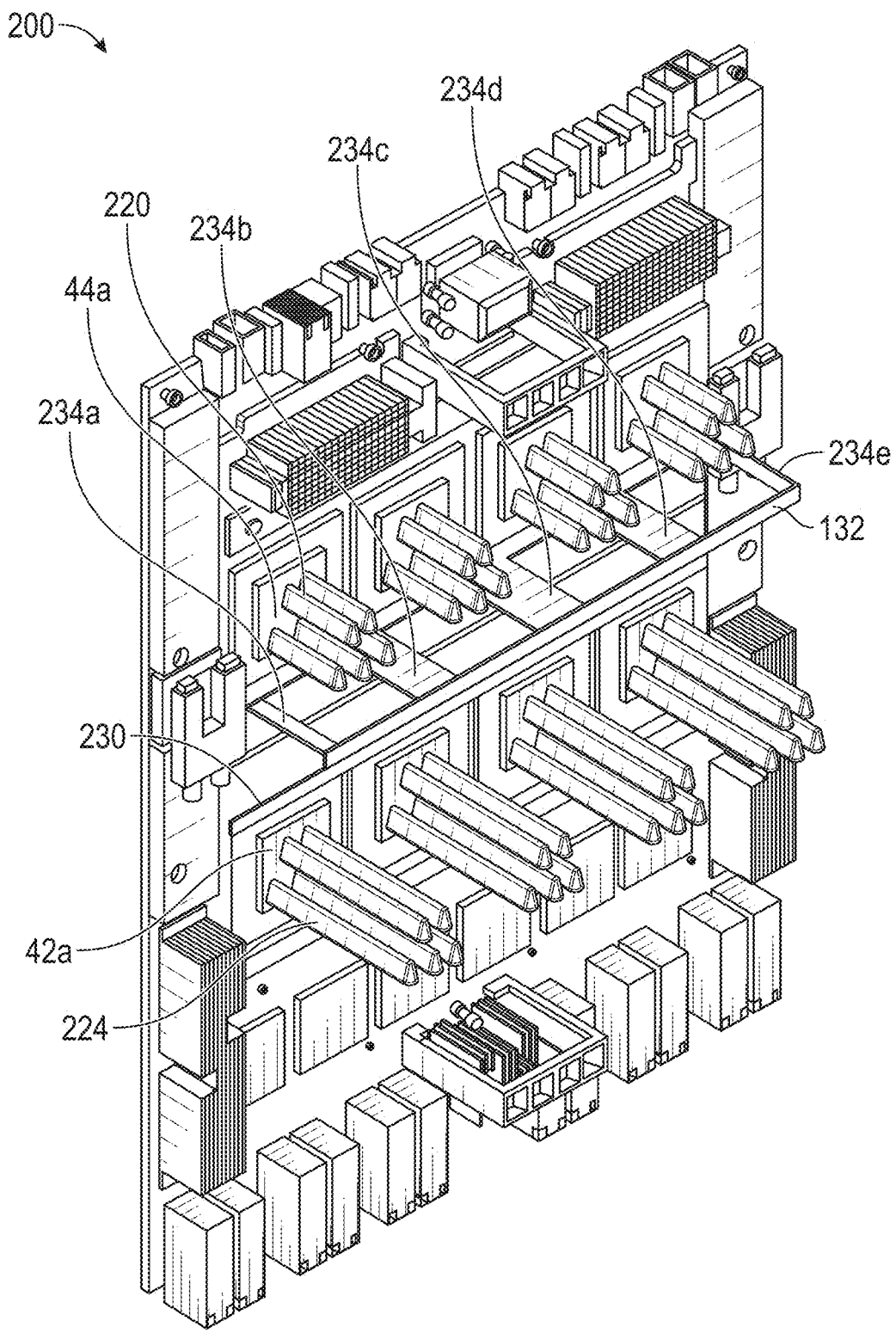
FIG. 7A is an upper front left perspective view of aspects of an embodiment of a liquid immersion cooling system.

FIG. 7A is an upper front left perspective view of aspects of an embodiment of a liquid immersion cooling system 200. In FIG. 7A, system 200 includes short VC pillars 220 connected to plates 44 and long VC pillars 224 connected to plates 42. With only short VC pillars 220 in the upper row, a different distribution of bubbles is created in comparison to system 100, which may be advantageous in some situations. A bubble guide 230 includes face 132, which functions as described above. Bubble guide 230 also includes vanes 234a . . . 234d, which are horizontally oriented such that they support guide face 132 channel the flow of returning high density fluid directly to each upper plate 44.

Figure 7B:
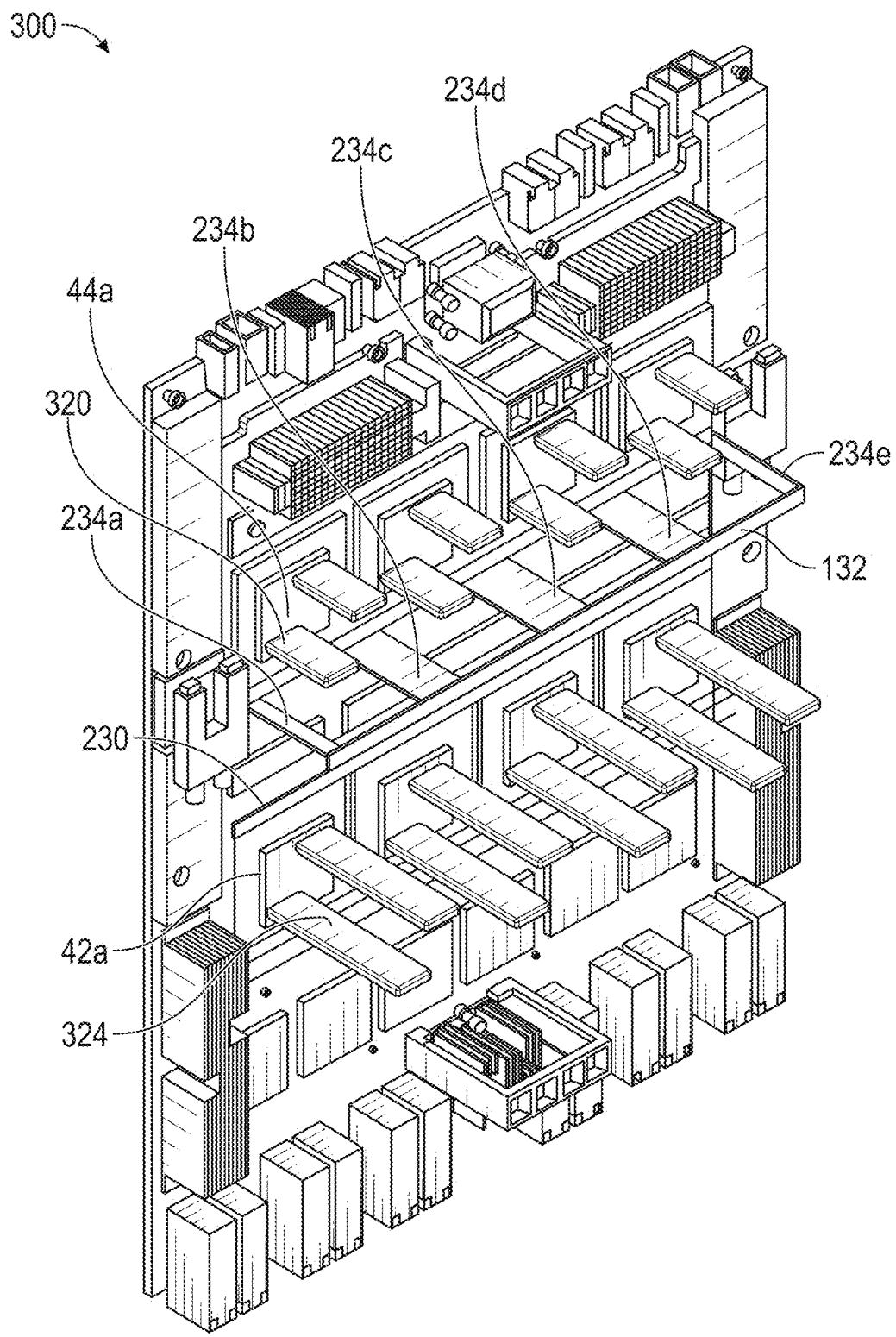
FIG. 7B is an upper front left perspective view of aspects of an embodiment of a liquid immersion cooling system.

FIG. 7B is an upper front left perspective view of aspects of an embodiment of a liquid immersion cooling system 300. In FIG. 7A, system 300 includes short VC pillars 320 connected to plates 44 and long VC pillars 324 connected to plates 42. With only short VC pillars 220 in the upper row, a different distribution of bubbles is created in comparison to system 100, which may be advantageous in some situations. Similarly, the horizontal orientation of both VC pillars 320, 324 creates a different distribution of bubble, which may also be advantageous in some situations. System 300 also include bubble guide 230.

Generally, nucleation sites will form in zones with high power density. An objective of using VC pillars is to force nucleation sites to previously low power density zones. Thus, in embodiments, VC pillars are employed for the following reasons: to create nucleation sites in areas of lower power density; to provide additional heat transfer area; and to spread heat to all nucleation sites. Benefits from the creation of nucleation sites in area of lower power density include: a decrease in impedance and increase vapor flow rate; heat is diverted from other hot components; flow paths are organized; and, if component A has a component B above it that also has VC pillars installed, the boiler plates for component A may have different shapes and sizes to help divert bubbles from contacting component B. Benefits of additional heat transfer area include: avoiding dry out; and an increase in nucleation sites. Benefits of spreading heat to all nucleation site include: the spread of heat from hot spots on the boiler plate to fully utilize the heat transfer area of the VC pillar.

In embodiments, additional VC pillar configurations include: vertical nucleation sites with bottom row pillars that are longer than top row pillars, as shown in FIG. 7A; vertical nucleation sites with top and bottom row pillars have alternating lengths, as shown in FIG. 5; and horizontal nucleation sites with bottom row pillars that are longer than top row pillars, as shown in FIG. 7C.

Embodiments may provide one or more of the following features: 1) a vapor chamber base that spreads heat to a remote location away from the boiler plate; 2) additional nucleation sites that minimize interference between rising bubbles such that components may be situated in additional regions of the board; 3) vapor chambers pillars that create surfaces with flexible orientation and that can be different from that of the component that it is attached to; 4) vapor chambers that have flexible shapes and sizes and are not limited to the rectangular extrusions; and 5) the utilization of heat from the GPU or boiler plate itself to create a dynamic recirculation with the addition of the bubble guide and vanes which create organized flow paths that enhance the phase change efficiency and minimize the interference between rising bubbles and components.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
 a deflector mounted to a board in a space between a first heat source connected to the board and a second heat source connected to the board, the deflector having a first face and a second face opposing the first face, the first face ramping away from the board as the deflector approaches the second heat source; and a plurality of vanes extending from the first face of the deflector and rotated inwardly with respect to the first face, wherein, when the first and second heat sources are immersed in a fluid and oriented with the second heat source above the first heat source, as the fluid is heated by the first heat source, the heated fluid within the fluid rises and is directed by the deflector away from the second plane and is directed by the plurality of vanes toward a center of the deflector.

2. The apparatus of claim 1, wherein each of the plurality of vanes are both rotated inwardly and curved inwardly with respect to the first face.

3. The apparatus of claim 1, wherein the first plane and the second plane are co-planar.

4. The apparatus of claim 1, wherein the first heat source includes a first plurality of individual heat sources, and the second heat source includes a second plurality of individual heat sources.

5. The apparatus of claim 1, further comprising: a first heat sink connected to the first heat source, and a second heat sink connected to the second heat source.

6. The apparatus of claim 5, wherein the first heat sink includes a first vapor chamber, and the second heat sink includes a second vapor chamber.

7. The apparatus of claim 6, wherein the first and second vapor chambers are at least partially coated with boiling enhancement coating.

8. The apparatus of claim 6, wherein the first vapor chamber is oriented perpendicularly from the first plane and the second vapor chamber is oriented perpendicularly from the second plane.

9. The apparatus of claim 8, wherein the first vapor chamber is longer than the second vapor chamber.

10. The apparatus of claim 9, further comprising a third vapor chamber oriented perpendicularly from the first plane and a fourth vapor chamber oriented perpendicularly from the second plane, wherein: the fourth vapor chamber is longer than the third vapor chamber, the second vapor chamber is positioned above the first vapor chamber, and the fourth vapor chamber is positioned above the third vapor chamber.

11. A method for improving the cooling of a heat source, the method comprising:

mounting a deflector to a board in a space between a first heat source connected to the board and aligned with a first plane and a second heat source connected to the board and aligned with a second plane, the deflector having a center, a first face, a second face opposing the first face, and a plurality of vanes extended from a first face of the deflector and rotated inwardly with respect to the first face, and, after mounting, the first face of the deflector ramping away from the board such that the first face of the deflector is further from the board as the deflector approaches the second heat source; and immersing the deflector, first heat source, and second heat source in a fluid with the second heat source positioned above the first heat source;

heating the fluid using the first heat source, which progressively decreases the density of the fluid, creating lower-density fluid within the fluid that rises from the first heat source toward the deflector;

deflecting, by the deflector, a portion of the lower-density fluid away from the second plane thereby preventing the lower-density fluid from encountering the second heat source; and directing toward the center of the deflector, by the plurality of vanes, a portion of the lower-density fluid that contacts the deflector.

12. The method of claim 11, further comprising before the immersing step:

connecting a first vapor chamber to the first heat source; and connecting a second vapor chamber to the second heat source.

13. The method of claim 11, wherein each of the plurality of vanes are both rotated inwardly and curved inwardly with respect to the first face.

14. The method of claim 11, wherein the first heat source includes a first plurality of individual heat sources, and the second heat source includes a second plurality of individual heat sources.

15. The method of claim 11, further comprising before the immersing step:

connecting a first heat sink to the first heat source; and connecting a second heat sink to the second heat source.

16. The method of claim 15, wherein the first heat sink includes a first vapor chamber, and the second heat sink includes a second vapor chamber.

17. The method of claim 16, wherein the first and second vapor chambers are at least partially coated with boiling enhancement coating.

18. The method of claim 16, wherein the first vapor chamber is oriented perpendicularly from the first plane, and the second vapor chamber is oriented perpendicularly from the second plane.

19. The method of claim 18, wherein the first vapor chamber is longer than the second vapor chamber.

20. The method of claim 19, further comprising before the immersing step:

connecting a third vapor chamber to the first heat source such that the third vapor chamber is oriented perpendicularly from the first plane; and connecting a fourth vapor chamber to the second heat source, the fourth vapor chamber being longer than the third vapor chamber and oriented perpendicularly from the second plane, wherein, when connected, the second vapor chamber is positioned above the first vapor chamber and the fourth vapor chamber is positioned above the third vapor chamber.

* * * * *